United States Patent
Su

(10) Patent No.: US 8,257,125 B2
(45) Date of Patent: Sep. 4, 2012

(54) WIRING METHOD FOR CHECKING WIRINGS OF AN ORGANIC ELECTROLUMINESCENT DISPLAY

(75) Inventor: Junhai Su, Shan Wei (CN)

(73) Assignee: Truly Industry Limited, Shan Wei, Guang Dong Province (CN)

( * ) Notice: Subject to any disclaimer, the term of this patent is extended or adjusted under 35 U.S.C. 154(b) by 317 days.

(21) Appl. No.: 12/602,742

(22) PCT Filed: Nov. 2, 2007

(86) PCT No.: PCT/CN2007/003115
§ 371 (c)(1),
(2), (4) Date: Dec. 2, 2009

(87) PCT Pub. No.: WO2008/148263
PCT Pub. Date: Dec. 11, 2008

(65) Prior Publication Data
US 2010/0178833 A1 Jul. 15, 2010

(30) Foreign Application Priority Data
Jun. 8, 2007 (CN) .......................... 2007 1 0028501

(51) Int. Cl.
*H01L 51/56* (2006.01)
*H01J 9/42* (2006.01)

(52) U.S. Cl. .............................................. 445/3; 445/24

(58) Field of Classification Search .......... 313/500–512; 315/169.1–169.3
See application file for complete search history.

(56) References Cited

U.S. PATENT DOCUMENTS

| 7,038,395 | B2 * | 5/2006 | Kato ........................ 315/169.3 |
| 7,851,986 | B2 * | 12/2010 | Lee ............................... 313/500 |
| 2006/0028126 | A1 | 2/2006 | Lifka et al. |
| 2010/0163284 | A1 * | 7/2010 | Tanahara ........................ 445/24 |

FOREIGN PATENT DOCUMENTS

| CN | 1525182 | | 9/2004 |
| CN | 1589070 | | 3/2005 |
| CN | 1822737 | | 8/2006 |
| CN | 101083276 | | 12/2007 |
| EP | 1 763 014 A1 | | 3/2007 |
| EP | 2001055 A2 | * | 12/2008 |
| JP | 09138418 A | * | 5/1997 |
| JP | 2001100234 A | * | 4/2001 |

(Continued)

*Primary Examiner* — Mariceli Santiago
(74) *Attorney, Agent, or Firm* — Merchant & Gould P.C.

(57) ABSTRACT

A wiring method for checking wirings of an organic electroluminescent display, in which a plurality of organic electroluminescent displays are arranged and encapsulated on a large piece of glass substrate, a power contact block with a main checking wiring is arranged at one side of the glass substrate, the cathode and the anode of the display which is at the centre are connected to said main checking wirings through an electrically conductive cathode checking wiring and an electrically conductive anode checking wiring, respectively. The main checking wirings connect the plurality of displays to the power contact block in series or parallel at a side of the glass substrate, wherein said cathode checking wiring may be connected to the cathode from any side of the display, then be wired and extended out, said anode checking wiring may be wired and extended out from other one side other than the anode end side which is connected to the integrate circuit for the display, and the anode checking wiring is only is connected to other end of the anode.

19 Claims, 2 Drawing Sheets

FOREIGN PATENT DOCUMENTS

| | | | |
|---|---|---|---|
| JP | 2003108024 A | * | 4/2003 |
| JP | 2004-063407 | | 2/2004 |
| JP | 2004-1824248 | | 7/2004 |
| JP | 2005-099414 | | 4/2005 |
| JP | 2005274932 A | * | 10/2005 |

* cited by examiner

WIRING METHOD FOR CHECKING WIRINGS OF AN ORGANIC ELECTROLUMINESCENT DISPLAY

CROSS-REFERENCE TO RELATED APPLICATIONS

This application is a National Stage Application of PCT/CN2007/003115, filed Nov. 2, 2007, which claims benefit of Serial No. 200710028501.0, filed Jun. 8, 2007 in China and which applications are incorporated herein by reference. To the extent appropriate, a claim of priority is made to each of the above disclosed applications.

FIELD OF THE INVENTION

The invention relates to an wiring method for check lines of organic electroluminescent displays, and in particular, to a wiring method for check lines that can be used to check the defects over a glass substrate of organic electroluminescent displays by powering on the entire-sheet or a single display, which especially can be applied in the design of organic electroluminescent display products in the form of Chip On Glass (COG).

BACKGROUND OF THE INVENTION

Organic electroluminescent display is a newly emerging flat panel display. It has the advantages such as actively emitting light, providing a high contrast, being able to be thinned and having a high response speed. Therefore it is generally recognized as a is main force of the next generation display. The luminescence principle of an organic electroluminescent display lies in that, various functional layers including a charge injection layer, a charge transport layer and a luminescent layer are inserted between the cathode and anode, and then an appropriate voltage is applied between the cathode and anode to allow the device to emit light.

During the mass production of organic electroluminescent displays, the produced products need to be powered on for a certain time, so as to get rid of the defective products and to age those that have no defect to improve their stability and uniformity of performance greatly. Because of the strict demands of the packaging techniques, the packaging cost of Integrated Circuits (ICs) is rather high. Therefore, the industry is inclined to directly fit the Integrated Circuits (ICs) on the glass, i.e. using the Chip On Glass (COG) method, so as to omit the packaging of the ICs, thereby reducing the cost significantly. Currently the existing power-on test and aging of organic electroluminescent displays are generally performed to the entire sheet of the substrate glass which contains a plurality of displays. The anodes and cathodes of the plurality of displays are extended to the outside of a back cover of the substrate and connected to a power supply, respectively. When powered on, the test and aging may be performed. In this method, the back cover has to be cut or a hole has to be dug through the back cover, to expose the anode and cathode of each display and connect them to the power supply for the purpose of the power-on test and aging. In addition, the leads of the anode and cathode of each display are extended from their pins and connected to the power supply to power on the devices. However, this method can not be applied to the COG displays since the leads of the anodes and cathodes of such displays can not be extended to the edges of the displays. In other words, the existing method of power-on test and aging can not be utilized to test and age the COG displays. Therefore, a new method is desired which does not need to extend the anodes and cathodes from the pin ends of the integrated circuits fitted in the displays, and by which the anodes and cathodes can still be connected to the power supply and powered on to test and age the displays.

SUMMARY OF THE INVENTION

Some embodiments of the invention provide a wiring method for check lines of organic electroluminescent displays. Through the check lines, an entire-sheet of the produced organic display devices or a single display may be powered on to be test or aged, especially for the Chip On Glass (COG) products.

An embodiment of the invention provides a wiring method for check lines of organic electroluminescent displays. The method may include: arranging and encapsulating a plurality of organic electroluminescent displays on a sheet of substrate glass for the organic electroluminescent displays; disposing a power contact block of main check line at one side of the sheet of substrate glass; connecting a cathode and an anode of an organic electroluminescent display disposed at the center to the main check line via a cathode check line and an anode check line, respectively; connecting, via the main check line, the plurality of organic electroluminescent displays in series or in parallel, and connecting, via the main check line, the plurality of organic electroluminescent displays to the power contact block at the one side of the sheet of substrate glass. A new wiring method of cathode and anode check lines and main check lines is employed, wherein the cathode check line is extended out at any side of the organic electroluminescent display after being connected to the cathode, and the anode check line is extended out at the other side of the organic electroluminescent display, other than the side connected to an anode lead of the integrated circuit of the display, and wherein the anode check line is connected to the other end of the anode and is not connected to the anode lead (i.e. the pin end of the fitted integrated circuit) of the anode. In this way, when the displays are to be tested or aged, only the portion, which covers the power contact block on the substrate glass, of the back cover of the substrate glass needs to be cut away so as to supply power for test or aging. For example, when the displays are connected in parallel, the length and thickness of the main check line at each of the two sides of each organic electroluminescent display in the parallel circuit have to be designed so that the each parallel branch has the same resistance, so as to ensure that the current flowing through each organic electroluminescent display during the power-on test or aging to be the same, thereby enabling the uniform test or aging.

Another embodiment of the invention provides a wiring method for check lines of organic electroluminescent displays. The method may include: arranging and encapsulating a plurality of organic electroluminescent displays on a sheet of substrate glass for the organic electroluminescent displays; disposing power contact blocks of cathode and anode check lines between the displays over the sheet of substrate glass; connecting a cathode and an anode of each single display of the plurality of organic electroluminescent displays to a power contact block of the power contact blocks via a cathode check line and an anode check line, respectively; wherein the cathode check line is extended out at any side of the organic electroluminescent display after being connected to the cathode, and the anode check line is extended out at other side of the single display, other than the side connected to an anode pin of an integrated circuit of the single display, and wherein the anode check line is connected to the other end of the is anode. In this method, the power contact block(s) is exposed by cutting the back cover or digging hole(s) through the back cover, and then connected to the power supply. When power contact block(s) is powered, the single display or all the displays on the substrate glass can be powered on for test and aging.

The solutions according to the embodiments of the invention have the following advantages over the existing technology:

(1) New wiring methods are employed, in which the anode and cathode of a display are connected to the main check line via the new anode and cathode check lines, and then the main check line is connected to the power contact block. With the methods, the problem that entire-sheet power-on testing or aging can not be performed to the COG organic electroluminescent displays before being fitted with the integrated circuits (ICs) is solved.

(2) The check lines according to the embodiment of the invention can be made at the same time with the pattern of the displays. This will bring about no additional cost. In addition, the fabrication process is rather simple.

(3) The design of check lines according to the embodiment of the invention can enable the entire-sheet test and aging of any type of organic electroluminescent displays, particularly the COG organic electroluminescent displays, thereby greatly enhancing the working efficiency with a reduced cost.

BRIEF DESCRIPTION OF THE DRAWINGS

The invention is further described below in conjunction with some embodiments and the accompanying drawings.

DETAILED DESCRIPTION OF THE INVENTION

The following description is made with reference to the embodiments as shown in the Figures.

Figure 1:
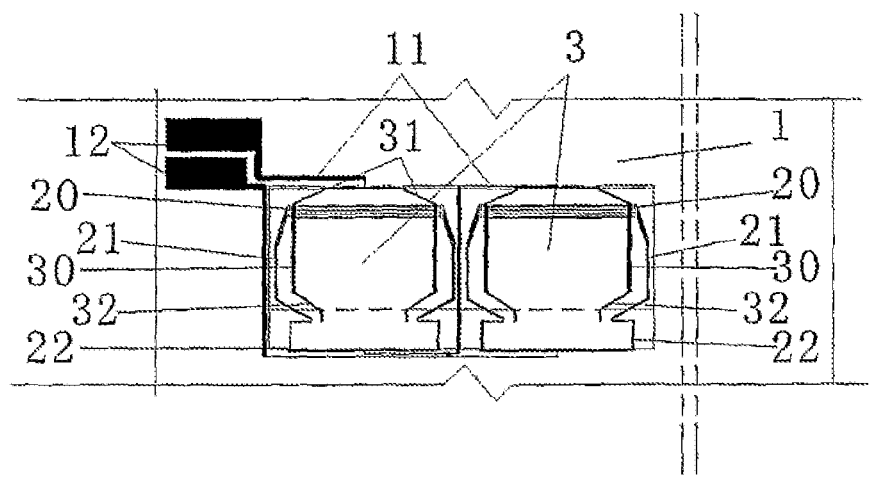
FIG. 1 is a schematic diagram showing each row of displays being connected in series via check lines.

In the first embodiment of the invention as shown in FIG. 1, a plurality of organic electroluminescent displays 3 are arranged and encapsulated on a substrate glass 1. The substrate glass 1 can be further used as the substrate glass 1 at the front side of the organic electroluminescent displays 3. A power contact block 12 of main check line(s) 11 is arranged at the left side of the substrate glass 1. Cathodes 20 and anodes 30 of the row of organic electroluminescent displays 3 located at the center of the substrate glass are connected in series to the electrically conductive main check line 11 via cathode leads 21 and anode check lines 31, and are connected to the power contact block 12 at the left (or right) side of the substrate glass 1. The check lines that are connected in series are distributed in a region which is outside the organic luminescent layer of each row of organic electroluminescent displays 3. When the power contact block 12 is powered, current may flow through the main check line 11 to the anode check line 31 and anode 30 of the first display 3 and flow to the organic luminescent layer; then flow through the cathode 20, the cathode lead 21 and a cathode check line 22 to the main check line 11, then flow through the main check line 11 to the second display 3. The rest may be deduced by analogy, i.e. the current then flows to the third display 3, the fourth display 3, . . . . In this way, all the displays 3 on the whole sheet of the substrate glass can be powered on for test or aged before the substrate glass is cut. Since the current flowed through each display 3 on the series connection is the same, the luminance of each display 3 when being powered on and aged is uniform. A disadvantage lies in that a relatively high voltage is required when the number of displays 3 increases, which presents a high demand for the devices.

In the above structure, an anode check line 31 is connected to the anode 30 of a display 3. The anode check line is not extended out from the anode lead 32 of the fitted integrated circuit (IC), instead it is extended out from the other end of the anode 30.

In the embodiment, both the left and right sides of the substrate glass 1 may each be disposed with a power contact block 12 of the main check line 11. Alternatively, the power contact block 12 of the main check line 11 can be disposed only at the left or right side of the substrate glass 1.

A method of making the main check line 11, the cathode check line 22 and the anode check line 31 on the substrate glass 1 of the organic electroluminescent displays 3 may include the following steps:

(1) The substrate glass 1 is cleaned, so as to enhance the adhesion between the substrate glass 1 and photo-resist;

(2) An anti-etch photosensitive protection layer (such as photo-resist) is coated on the side, having a conductive layer thereon, of the substrate glass 1. The coating may be implemented by spin coating, roll coating, screen printing or the like. The thickness of the anti-etch photosensitive protection layer may be any value between 0.5 μs-50 μs. The thickness may be determined depending on the concentration of the etch solution, the etch time and the like;

(3) The substrate glass 1 which is coated with the anti-etch photosensitive protection layer is disposed under a prefabricated mask to be exposed, developed and cured, so that a photosensitive protection pattern of main check line 11 at a non-display area outside the organic luminescent layer of each row or column of organic electroluminescent displays 3 over the substrate glass 1; the main check line 11 should be wired so as to made it convenient to be electrically connected in series or in parallel with the anodes 30 and cathodes 20 of the row of organic electroluminescent displays 3;

(4) The exposed and developed substrate glass 1 is etched by using an etch solution, to remove from the substrate glass 1 the conductive layer except the photosensitive protection pattern;

(5) The anti-etch photosensitive protection layer on the pattern of the main check line 11, the cathode check lines 22 and the anode check lines 31 is removed by using an alkali liquor with a weight ratio of 2-10%, thereby obtaining the desired cathode check lines 22, anode check lines 31, main check line 11 and power contact block 12.

In the above step (3), the pattern of the main check line 11, the cathode check lines 22 and the anode check lines 31 may be fabricated at the same time with the photosensitive protection pattern of the organic electroluminescent displays 3 (mainly for the anodes 30), with no additional cost while greatly enhancing the working efficiency.

The Second Embodiment

Figure 2:
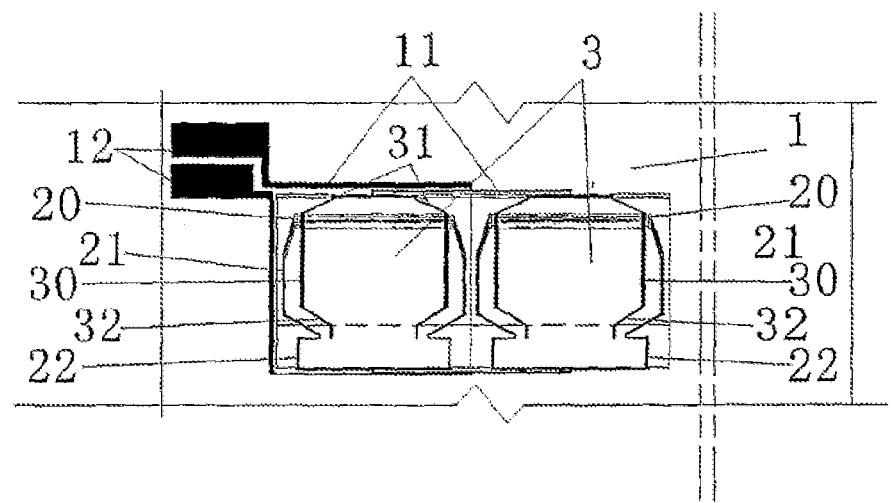
FIG. 2 is a schematic diagram showing each row of displays being connected in parallel via check lines.

FIG. 2 illustrates the second embodiment of the invention. Different from the first embodiment, in the second embodiment each row of displays 3 on the substrate glass 1 are connected in parallel via the main check lines 11, and are extended to the power contact block 12 at the left side or right side of the substrate glass 1. Similarly the check lines that are connected in parallel also are distributed on the non-display area outside the organic luminescent layer of the each row of organic electroluminescent displays 3. When the power contact block 12 is powered, current may flow through the main check lines 11 to the anode check line 31 and anode 30 of each display 3 and flow to the organic luminescent layer; then flow through the cathode 20, the cathode lead 21 and the cathode check line 22 of each display 3 to the main check lines 11. In this way, all the displays 3 on the whole sheet of the substrate glass can be powered on to be test or aged before the substrate glass is cut. The anode check line 31 is connected to the anode 30 of a display 3. The anode check line is not extended out from the anode lead 32 of the fitted integrated circuit (IC), instead it is extended out from the other end of the anode 30.

Connecting the displays 3 in parallel via the main check lines 11 has the advantage that the voltage to be supplied can be low. The disadvantage lies in that the current flowing to each row of displays is prone to be non-uniform. In general the displays located at the sides of a row will be brighter than those located at the center of the row. This tends to make the power-on test and aging of the whole row of displays 3 non-uniform. To overcome the disadvantage, the resistance of the parallel circuit has to be calculated accurately. The length and thickness of the main check line 11 at each of the two sides of each organic electroluminescent display 3 in the parallel circuit have to be designed so that the each parallel branch has the same resistance. In this way, it can be ensured that the current flowing through each organic electroluminescent display 3 during the power-on test or aging to be the same, thereby enabling the uniform power-on test or aging of the whole row of displays 3 when powered on.

Alternatively, each column of displays can be connected in series or in parallel via the main check line 11. In these cases, the power contact block 12 may be disposed at the upper or lower side of the substrate glass 1.

The Third Embodiment

Figure 3:
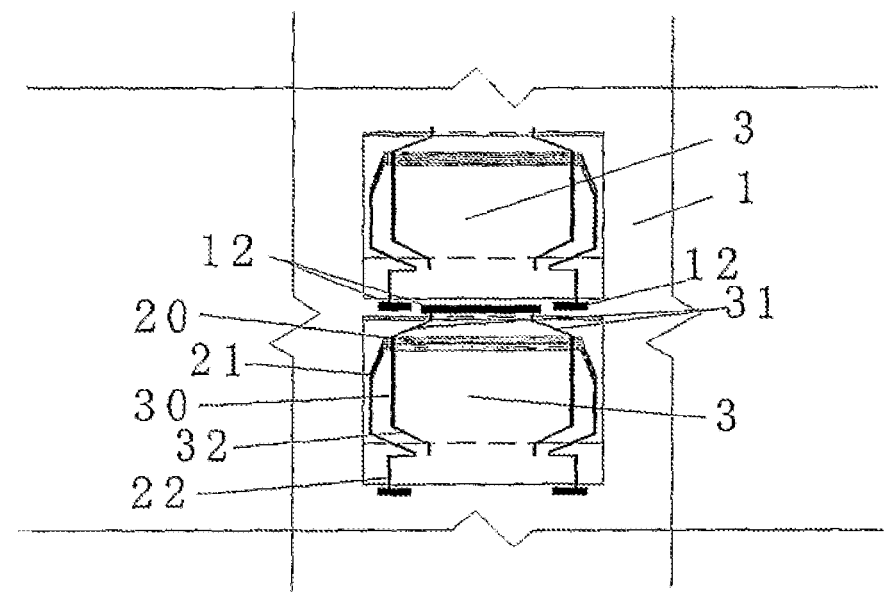
FIG. 3 is a schematic diagram showing a single display being connected to a power connect block via cathode and anode check lines.

FIG. 3 illustrates the third embodiment of the invention. Different from the first embodiment, in the third embodiment power contact blocks 12 are arranged between the displays 3 on the substrate glass 1. The cathode 20 and anode 30 of each display 3 are connected to a power contact block 12 via the cathode lead 21, the cathode check line 22 and the anode check line 31, respectively. The encapsulation back cover of the sheet of the substrate glass is cut or holes are dug through the back cover, at the locations at which the power contact blocks 12 are disposed, so as to expose the power contact blocks 12 to contact with the power supply. When powered, current may flow through each power contact block 12 to the anode check line 31 and anode 30 of each display 3 and flow to the organic luminescent layer; then flow through the cathode 20, the cathode lead 21 and the cathode check line 22 of each display 3 back to the power contact block. In this way, each single display 3 can be powered on to be test or aged. The anode check line 31 is connected to the anode 30 of the display 3. The anode check line is not extended out from the anode lead 32 of the fitted integrated circuit (IC), instead it is extended out from the other end of the anode 30.

In the embodiment, the power contact blocks 12 may be connected in series or in parallel via peripheral connectors, so as to power on all the displays 3 over the whole sheet of the substrate glass 1 at the same time.

Connecting each single display to a power contact block has the disadvantage that the arrangement of the power contact blocks 12 may occupy large space on the substrate glass 1, thereby reducing the number of displays 3 that can be arranged on the substrate glass 1. In addition, the encapsulation back cover 2 has to be cut or holes have to be dug through the back cover to expose and connect the power contact blocks 12 to the power supply.

The Fourth Embodiment

Figure 4:
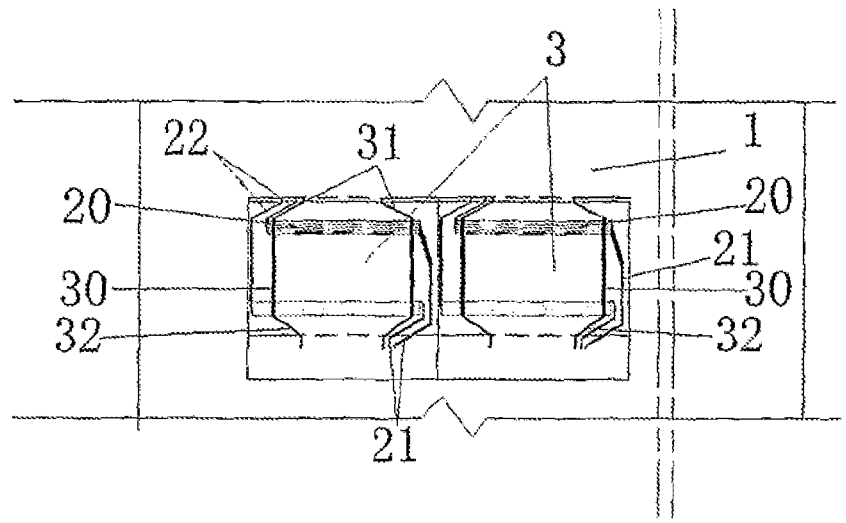
FIG. 4 is a schematic diagram showing both the cathode and anode check lines of a display being extended out at the top of the display.

FIG. 4 illustrates the fourth embodiment of the invention. Different from the first embodiment, in the fourth embodiment the anode check line 31 and cathode check line 22 of a display 3 both are extended out at the top of the display 3, and are connected to the main check line 11 as shown in FIG. 1 or 2 or connected to the power contact block 12 as shown in FIG. 3. When the power contact block 12 is powered, current may flow through the main check line 11 to the anode check line 31 and anode 30 of each display 3 and flow to the organic luminescent layer; then flow through the cathode 20, the cathode lead 21 and the cathode check line 22 of each display 3 to the main check lines 11 or directly to the power contact block 12. In this way, all the displays 3 on the whole sheet of the substrate glass can be powered on to be test or aged before the substrate glass is cut. The anode check line 31 is connected to the anode 30 of a display 3. The anode check line is not extended out from the anode lead 32 of the fitted integrated circuit (IC), instead it is extended out from the other end of the anode 30.

The Fifth Embodiment

Figure 5:
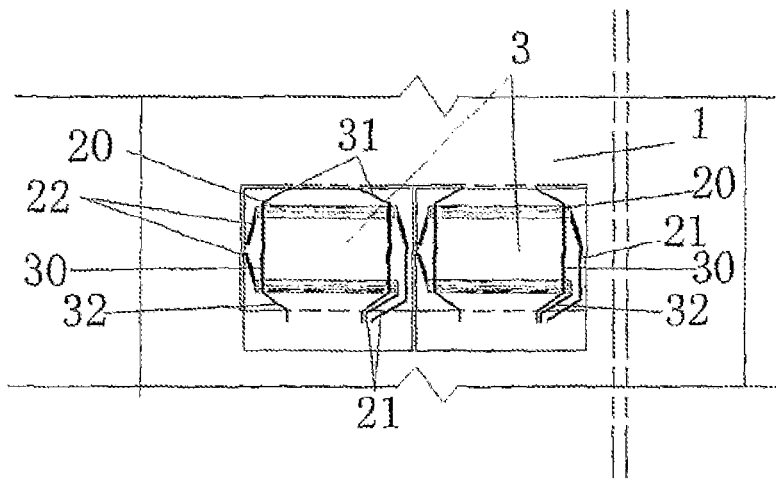
FIG. 5 is a schematic diagram showing the cathode check line and anode check line of a display being extended out at the left side and the top of the display, respectively.

FIG. 5 illustrates the fifth embodiment of the invention. Different from the last embodiment, in the fifth embodiment while the anode check line 31 of a display 3 is extended out at the top of the display 3, the cathode check line 22 of the display 3 is extended out at the left side of the display 3, and the node check line 31 and the cathode check line 22 are connected to the main check line 11 as shown in FIG. 1 or 2 or connected to the power contact block 12 as shown in FIG. 3. When the power contact block 12 is powered, current may flow through the main check line 11 to the anode check line 31 and anode 30 of each display 3 or the current may directly flow through the anode check line 31 and anode 30 of each display 3, and then to the organic luminescent layer; then the current flow through the cathode 20, the cathode lead 21 and the cathode check line 22 of each display 3 to the main check lines 11 or directly to the power contact block 12. In this way, all the displays 3 on the whole sheet of the substrate glass can be powered on to be test or aged before the substrate glass is cut. The anode check line 31 is connected to the anode 30 of a display 3. The anode check line is not extended out from the anode lead 32 of the fitted integrated circuit (IC), instead it is extended out from the other end of the anode 30.

Alternatively, the cathode check line 22 may be extended out at the right side of the display 3, and then connected to the main check line 11 as shown in FIG. 1 or 2 or connected to the power contact block 12 as shown in FIG. 3.

The Sixth Embodiment

Figure 6:
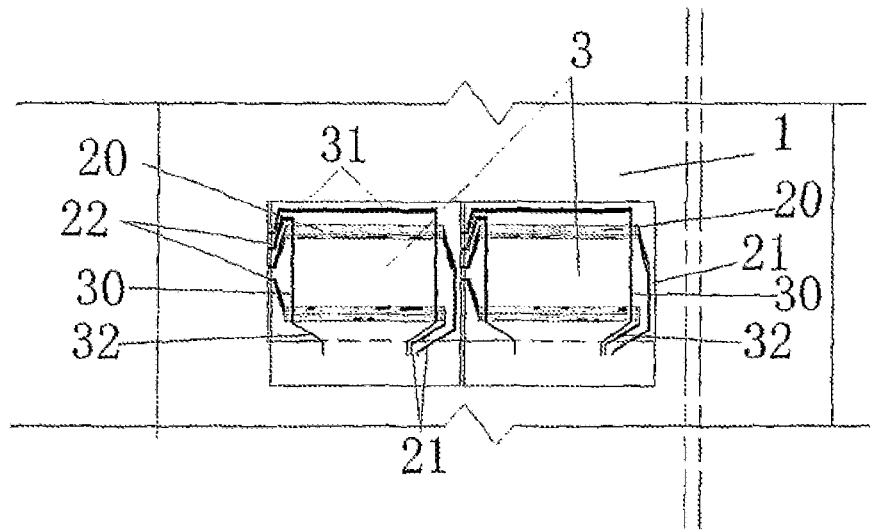
FIG. 6 is a schematic diagram showing both the cathode and anode check lines of a display being extended out at the left side of the display.

FIG. 6 illustrates the sixth embodiment of the invention. In the sixth embodiment the anode check line 31 and cathode check line 22 of a display 3 both are extended out at the left (or right) side of the display 3, and are connected to the main check line 11 as shown in FIG. 1 or 2 or connected to the power contact block 12 as shown in FIG. 3. When the power contact block 12 is powered, current may flow through the main check line 11 to the anode check line 31 and anode 30 of each display 3 or the current may directly flow through the anode check line 31 and anode 30 of each display 3, and then to the organic luminescent layer; then flow through the cathode 20, the cathode lead 21 and the cathode check line 22 of each display 3 to the main check lines 11 or directly to the power contact block 12. In this way, all the displays 3 on the whole sheet of the substrate glass can be powered on to be test or aged before the substrate glass is cut. The anode check line 31 is connected to the anode 30 of a display 3. The anode check line is not extended out from the anode lead 32 of the fitted integrated circuit (IC), instead it is extended out from the other end of the anode 30.

Alternatively, the anode check line 31 as shown in FIG. 6 may be extended out at both of the left and right sides of the display 3, and then connected to the main check line 11 as shown in FIG. 1 or 2 or connected to the power contact block 12 as shown in FIG. 3.

What is claimed is:

1. A wiring method for check lines of organic electroluminescent displays, comprising:
    arranging and encapsulating a plurality of organic electroluminescent displays on a sheet of substrate glass for the organic electroluminescent displays;
    disposing a power contact block of a main check line at one side of the sheet of substrate glass;
    connecting a cathode and an anode of an organic electroluminescent display disposed at the center to the main check line via a cathode check line and an anode check line, respectively;
    connecting, via the main check line, the plurality of organic electroluminescent displays in series or in parallel, and connecting, via the main check line, the plurality of organic electroluminescent displays to the power contact block at the one side of the sheet of substrate glass,
    wherein the cathode check line is extended out at any side of the organic electroluminescent display after being connected to the cathode, and the anode check line is extended out at other side of the organic electroluminescent display, other than a side connected to an anode lead of an integrated circuit of the display, and wherein the anode check line is connected to non-pin end of the anode, and the cathode check line is extended out by extending a cathode lead to connect the cathode of the display to the main check line.

2. The wiring method for check lines of organic electroluminescent displays according to claim 1, wherein the cathode check line, the anode check line, and the main check line are distributed at non-display area outside an organic luminescent layer of the organic electroluminescent displays.

3. The wiring method for check lines of organic electroluminescent displays according to claim 1, wherein the cathode check line is extended out by extending the cathode lead at a lower side of the display at which an integrated circuit is fitted, to connect the cathode of the display to the main check line; and the anode check line is extended out at a top side of the display to connect the anode of the display to the main check line.

4. The wiring method for check lines of organic electroluminescent displays according to claim 1, wherein the cathode check line is extended out by extending the cathode lead at a lower side of the display at which an integrated circuit is fitted, to connect the cathode of the display to the main check line; and the anode check line is extended out at either of left and right sides of the display to connect the anode of the display to the main check line.

5. The wiring method for check lines of organic electroluminescent displays according to claim 1, wherein the cathode check line is extended out by extending the cathode lead at a lower side of the display at which an integrated circuit is fitted, to connect the cathode of the display to the main check line; and the anode check line is extended out at both of left and right sides of the display to connect the anode of the display to the main check line.

6. The wiring method for check lines of organic electroluminescent displays according to claim 1, wherein the cathode check line is extended out at either of left and right sides of the display to connect the cathode of the display to the main check line; and the anode check line is extended out at a top side of the display to connect the anode of the display to the main check line.

7. The wiring method for check lines of organic electroluminescent displays according to claim 1, wherein the cathode check line is extended out at either of left and right sides of the display to connect the cathode of the display to the main check line; and the anode check line is also extended out at either of left and right sides of the display to connect the anode of the display to the main check line.

8. The wiring method for check lines of organic electroluminescent displays according to claim 1, wherein the cathode check line is extended out at either of left and right sides of the display to connect the cathode of the display to the main check line; and the anode check line is also extended out at both of left and right sides of the display to connect the anode of the display to the main check line.

9. The wiring method for check lines of organic electroluminescent displays according to claim 1, wherein the cathode check line is extended out at a top side of the display to connect the cathode of the display to the main check line; and the anode check line is also extended out at both of left and right sides of the display to connect the anode of the display to the main check line.

10. The wiring method for check lines of organic electroluminescent displays according to claim 1, wherein the cathode check line and the anode check line each are extended out at a top side of the display to connect the cathode and anode of the display to the main check line, respectively.

11. A wiring method for check lines of organic electroluminescent displays, comprising:
    arranging and encapsulating a plurality of organic electroluminescent displays on a sheet of substrate glass for the organic electroluminescent displays;
    disposing power contact blocks of cathode and anode check lines between the displays over the sheet of substrate glass;
    connecting a cathode and an anode of each single display of the plurality of organic electroluminescent displays to a power contact block of the power contact blocks via a cathode check line and an anode check line, respectively;
    wherein the cathode check line is extended out at any side of the organic electroluminescent display after being connected to the cathode, and the anode check line is extended out at other side of the single display, other than a side connected to an anode pin of an integrated circuit of the single display, and wherein the anode check line is connected to the other end of the anode, and the cathode check line is extended out by extending a cathode lead to connect the cathode of the display to the main check line.

12. The wiring method for check lines of organic electroluminescent displays according to claim 2, wherein the cathode check line is extended out by extending the cathode lead at a lower side of the display at which an integrated circuit is fitted, to connect the cathode of the display to the main check line; and the anode check line is extended out at a top side of the display to connect the anode of the display to the main check line.

13. The wiring method for check lines of organic electroluminescent displays according to claim 2, wherein the cathode check line is extended out by extending the cathode lead at a lower side of the display at which an integrated circuit is fitted, to connect the cathode of the display to the main check line; and the anode check line is extended out at either of left and right sides of the display to connect the anode of the display to the main check line.

14. The wiring method for check lines of organic electroluminescent displays according to claim 2, wherein the cathode check line is extended out by extending the cathode lead at a lower side of the display at which an integrated circuit is fitted, to connect the cathode of the display to the main check line; and the anode check line is extended out at both of left and right sides of the display to connect the anode of the display to the main check line.

15. The wiring method for check lines of organic electroluminescent displays according to claim 2, wherein the cathode check line is extended out at either of left and right sides of the display to connect the cathode of the display to the main check line; and the anode check line is extended out at a top side of the display to connect the anode of the display to the main check line.

16. The wiring method for check lines of organic electroluminescent displays according to claim 2, wherein the cathode check line is extended out at either of left and right sides of the display to connect the cathode of the display to the main check line; and the anode check line is also extended out at either of left and right sides of the display to connect the anode of the display to the main check line.

17. The wiring method for check lines of organic electroluminescent displays according to claim 2, wherein the cathode check line is extended out at either of left and right sides of the display to connect the cathode of the display to the main check line; and the anode check line is also extended out at both of left and right sides of the display to connect the anode of the display to the main check line.

18. The wiring method for check lines of organic electroluminescent displays according to claim 2, wherein the cathode check line is extended out at a top side of the display to connect the cathode of the display to the main check line; and the anode check line is also extended out at both of left and right sides of the display to connect the anode of the display to the main check line.

19. The wiring method for check lines of organic electroluminescent displays according to claim 2, wherein the cathode check line and the anode check line each are extended out at a top side of the display to connect the cathode and anode of the display to the main check line, respectively.

* * * * *